United States Patent [19]
Krakauer

[11] Patent Number: 5,780,897
[45] Date of Patent: Jul. 14, 1998

[54] ESD PROTECTION CLAMP FOR MIXED VOLTAGE I/O STAGES USING NMOS TRANSISTORS

[75] Inventor: David Benjamin Krakauer, Cambridge, Mass.

[73] Assignee: Digital Equipment Corporation, Maynard, Mass.

[21] Appl. No.: 555,463

[22] Filed: Nov. 13, 1995

[51] Int. Cl.$^6$ ................................................ H01L 29/76
[52] U.S. Cl. .......................... 257/368; 257/358; 257/368; 257/360; 257/355
[58] Field of Search ................................ 257/360, 358, 257/368, 363, 486, 606, 603, 355, 481, 551; 327/94, 100, 112, 375

[56] References Cited

U.S. PATENT DOCUMENTS 4,630,162  12/1986  Bell et al. ................................. 361/56
5,477,078  12/1995  Beigel et al. ............................ 257/606
5,594,266   1/1997  Beigel et al. ............................ 257/355

*Primary Examiner*—Carl W. Whitehead
*Attorney, Agent, or Firm*—Christopher J. Cianciolo

[57] ABSTRACT

An electrostatic discharge protection device for protecting a mixed voltage integrated circuit against damage is provided which includes at least one pair of NMOS transistors connected in a cascode configuration. Each NMOS transistor pair includes a first transistor, having a drain region coupled to an I/O stage of the mixed voltage integrated circuit, and a gate region coupled to the mixed voltage integrated circuit's low power supply. The protection device also includes a second NMOS transistor, merged into the same active area as the first transistor, having a gate region and source region coupled to the ground plane of the mixed voltage integrated circuit. The drain region of the second transistor and the source region of the first transistor is constructed by a shared NMOS diffusion region. This shared diffusion region also constructs the common node coupling the source region of the first transistor to the drain region of the second. The shared diffusion area is a further benefit of the invention because its length controls the trigger voltage and the holding voltage of each cascode configured transistor pair. This electrostatic discharge protection device can be used either as a self protecting pull-down portion of a mixed voltage I/O stage or, in a further aspect of the present invention, as a separate electrostatic discharge clamp.

9 Claims, 11 Drawing Sheets

ESD PROTECTION CLAMP FOR MIXED VOLTAGE I/O STAGES USING NMOS TRANSISTORS

BACKGROUND OF THE INVENTION

This invention relates generally to integrated circuits and more specifically to electrostatic discharge protection of mixed voltage integrated circuits (IC's).

As it is known in the art, integrated circuits, and hence computer systems, were historically designed to operate with a 5 volt power supply. However, the rise of the laptop computer, the hand held video game, and the portable telephone markets obviated the need for increased performance and decreased power consumption. The integrated circuit designers were able to meet these challenges by reducing the geometry of the transistors which make up the integrated circuits used in the above mentioned industries. Since a transistor's physical size limits the voltage that the device can withstand before being damaged, the smaller geometry transistors were not capable of surviving the 5 volt signal levels. As a result, lower voltage standards were introduced.

The lower voltage standards were not immediately required in all facets of the electronic industry and therefore were not fully adopted. As engineers migrated to using the new standards, devices designed for use with the old standards were frequently interconnected in the same design with those designed for the new standards. Because of these mixed standard systems, integrated circuit designers needed to ensure that devices manufactured to the new, lower voltage standards would not be adversely harmed if used in 5 volt applications. These voltage tolerant devices are referred to as mixed voltage IC's.

One of the main problems with integrated circuits has been their extreme sensitivity to electrostatic discharge. Electrostatic discharge (ESD) is a high voltage electric pulse of extremely short duration which is usually caused by static electricity. When a transistor experiences a voltage of this magnitude, the oxide within the transistor breaks down and the device is damaged. Consequently, the input/output (I/O) pads of a mixed voltage integrated circuit need to be protected such that the ESD voltage shock does not reach, nor destroy, their oxide layers.

There are two types of mixed voltage IC's which employ different methods of normal operating mode protection. These two types present different challenges in protecting against electrostatic discharge. In the first type of mixed voltage IC, the core logic area operates at one voltage level while the I/O area operates at a different, usually higher, voltage. This type of IC is provided with two power supplies i.e. a low power supply for the core logic area and a high power supply for the I/O area. In the second type of mixed voltage IC, only a low power supply is provided and the external I/O area is designed to be tolerant of, and protected from, high level signals. It is this latter case which presents the most difficulty for providing robust ESD protection as will be shown below.

A common form of ESD protection is the use of a pair of diodes. Two diodes are formed at the I/O pad where one is connected to ground and the other to the supply voltage. The anode of a first diode is connected to the I/O pad while the cathode is connected to the supply voltage. The cathode of a second diode is connected to the same I/O pad while its anode is connected to ground. During an ESD event, when the voltage on the I/O pad reaches a value higher than the supply voltage or lower than ground level, the corresponding diode conducts. In this circumstance, the conducting diode shunts the current either to the supply voltage plane or to the ground plane to protect the transistors of the I/O driver.

The problem with using this configuration in a mixed voltage integrated circuit having only a low power supply is that during normal operation, when the voltage at the I/O pad rises to the high level, the diode will conduct and clamp the pad to the low power supply voltage. In this situation, the high level signal and the low level power supply are essentially shorted together which is unacceptable because the high level signal will be prevented from reaching its proper voltage. If the high level signal does not reach its appropriate voltage level, functional or timing errors could occur in integrated circuits coupled to the mixed voltage IC. Accordingly, this form of ESD protection is not acceptable for mixed voltage I/O pads.

Another common ESD protection strategy is to provide a single NMOS transistor pulldown to ground for each I/O driver. This transistor is designed to safely protect the driver by shunting the ESD current to electrical ground by operating in a low impedance mode called snap-back. However, in advanced CMOS processes, thin gate oxides and short channel lengths preclude the use of a single NMOS pulldown transistor in the I/O driver due to normal operation reliability phenomena such as hot carriers and time dependent dielectric breakdown. In these phenomena a strong field, generated from a high level power supply, across the short channel and thin oxide unacceptably degrades the NMOS pulldown transistor over its lifetime.

To avoid the single pulldown transistor problem described above, the I/O driver pulldown in mixed voltage CMOS processes is typically designed as a cascode configuration of two distinct and independently disposed NMOS transistors which serve as a mechanism to reduce the field strength across the channel and the oxide during normal operation. The cascode configuration is created by connecting a common node between the source of a first transistor and the drain of a second. The gate of the first transistor is tied to the supply voltage while the gate and source of the second transistor are tied to ground. The I/O pad and the pull-up portion of the I/O driver are connected to the drain of the first transistor. In normal mixed signal operating modes, the protection occurs because the voltage at the common node is limited to the supply voltage minus the threshold voltage of the transistor. Because of this voltage limitation, voltages across the oxides and channels of both devices are limited to safe levels.

Although this configuration limits voltages to safe levels in normal operating modes, it is inadequate for ESD protection because the transistors are laid-out as separate and distinct devices. During an ESD event, snap-back must occur in both of the transistors before the current can be shunted to ground. Since snap-back for two independent devices results in a much higher voltage being presented to the driver, this can both exceed the dielectric breakdown of the oxide and increase the power density at the drain junction. Both situations are unacceptable since they can result in damage to the integrated circuit.

Furthermore, in this cascode arrangement, in order to tailor the circuit to have a sufficiently high trigger voltage and low holding voltage, the channel length of each device must be increased separately. Increasing the channel length of each device has the undesired effects of increasing capacitance, reducing the drive strength, and increasing the channel leakage current of the driver.

A protection device is needed which is acceptable for use in a mixed voltage integrated circuit during normal operating modes as well as during ESD events.

SUMMARY OF THE INVENTION

In accordance with the present invention, an electrostatic discharge protection device for protecting a mixed voltage integrated circuit against damage includes at least one pair of NMOS transistors connected in a cascode configuration. Each NMOS transistor pair includes a first transistor, having a drain region coupled to an I/O stage of the mixed voltage integrated circuit, and a gate region coupled to the mixed voltage integrated circuit's low power supply.

The protection device also includes a second NMOS transistor, merged into the same active area as the first transistor, having a gate region and source region coupled to the ground plane of the mixed voltage integrated circuit. The drain region of the second transistor and the source region of the first transistor is constructed by a shared NMOS diffusion region. This shared diffusion region also constructs the common node coupling the source region of the first transistor to the drain region of the second.

The shared diffusion area is a further benefit of the invention because its length controls the trigger voltage and the holding voltage of each cascode configured transistor pair.

This electrostatic discharge protection device can be used either as a self protecting pull-down portion of a mixed voltage I/O stage or, in a further aspect of the present invention, as a separate electrostatic discharge clamp. In addition, a further advantage of this arrangement is that the length of the shared diffusion region of the two transistors may be altered to tailor both the trigger voltage and the holding voltage of both of the transistors in the cascode configured pair.

In accordance with another aspect of the present invention, a method for protecting a mixed voltage integrated circuit from damage caused by electrostatic discharge includes the steps of disposing at least one pair of cascode configured NMOS transistors in the same active area in a mixed voltage integrated circuit, and constructing a shared diffusion region which constructs the drain region of the first transistor and the source region of the second transistor of each pair as well as couples each pair of transistors.

In accordance with yet another aspect of the present invention, a layout of a cascode electrostatic discharge protection device includes an active area constructed of diffused PMOS material, and at least one cascode configuration of NMOS transistors. In each pair of transistors, two polysilicon regions construct the gate regions of the NMOS transistors. A first NMOS region is disposed in the active area to construct the drain of the first NMOS transistor. Likewise, a second NMOS region constructs the source of the first NMOS transistor as well as the drain of the second NMOS transistor. The source of the second NMOS transistor is then constructed by a third NMOS region, also disposed in the same active area.

With such an arrangement, a protection device is provided that is acceptable for use in a mixed voltage IC during normal operating modes as well as during ESD events.

BRIEF DESCRIPTION OF THE DRAWINGS

The foregoing features of this invention, as well as the invention itself, may be more fully understood from the following detailed description when read in conjunction with the accompanying drawings, in which.

DESCRIPTION OF A PREFERRED EMBODIMENT

Figure 1:
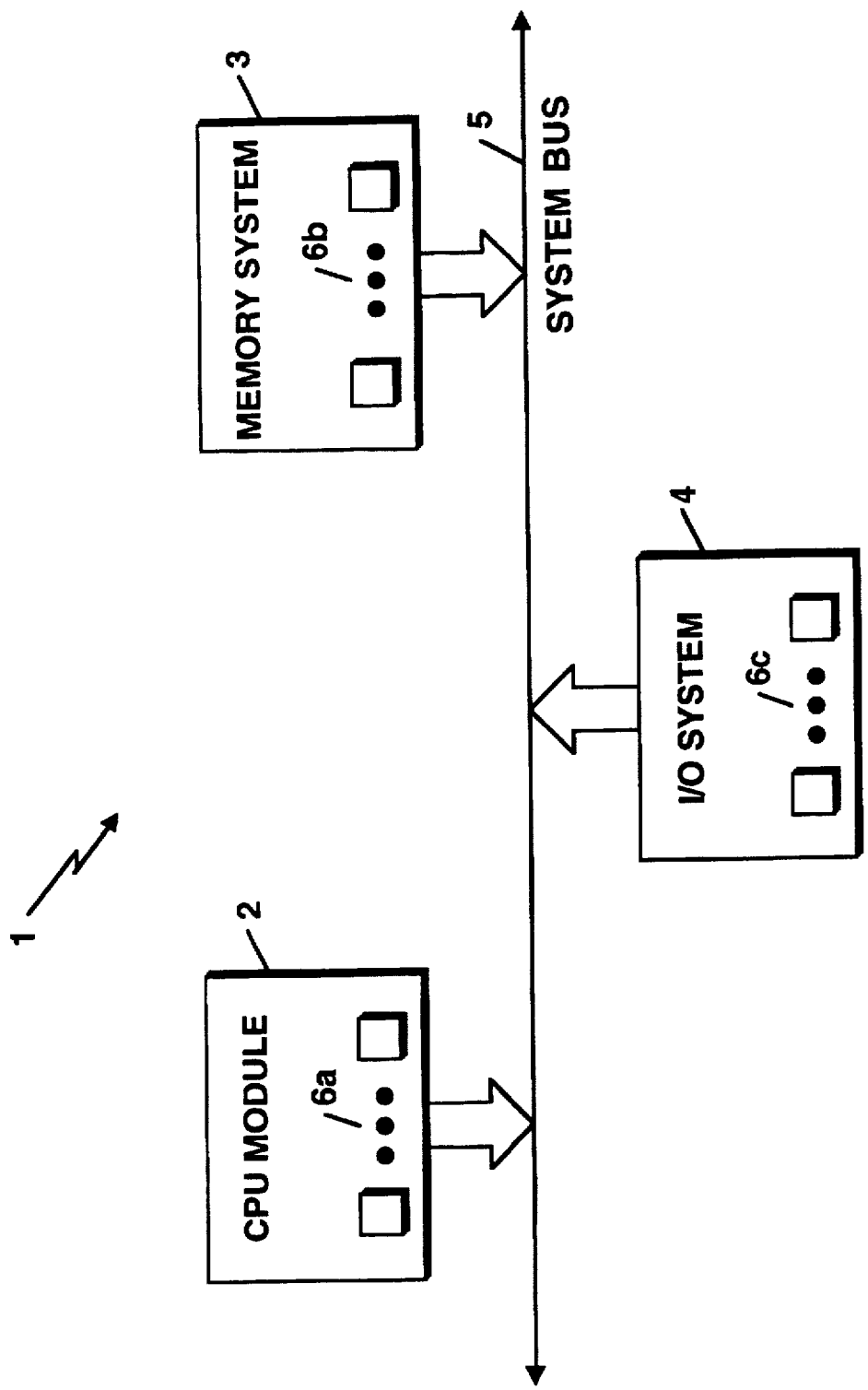
FIG. 1 depicts a block diagram of a computer system in which the present invention may be applied.

Referring to FIG. 1, a computer system 1 is shown to include a central processing unit (CPU) 2, a memory system 3, and an input/output (I/O) system 4, interconnected by a system bus 5. Each portion of the computer system 1 further comprises many coupled integrated circuits 6a, 6b, 6c, some of which run on a 5 volt power supply level and some of which run on lower voltage power supply levels. The present invention protects each of these integrated circuits from electrostatic discharge damage in such a way that does not hamper its normal operation.

Figure 2:
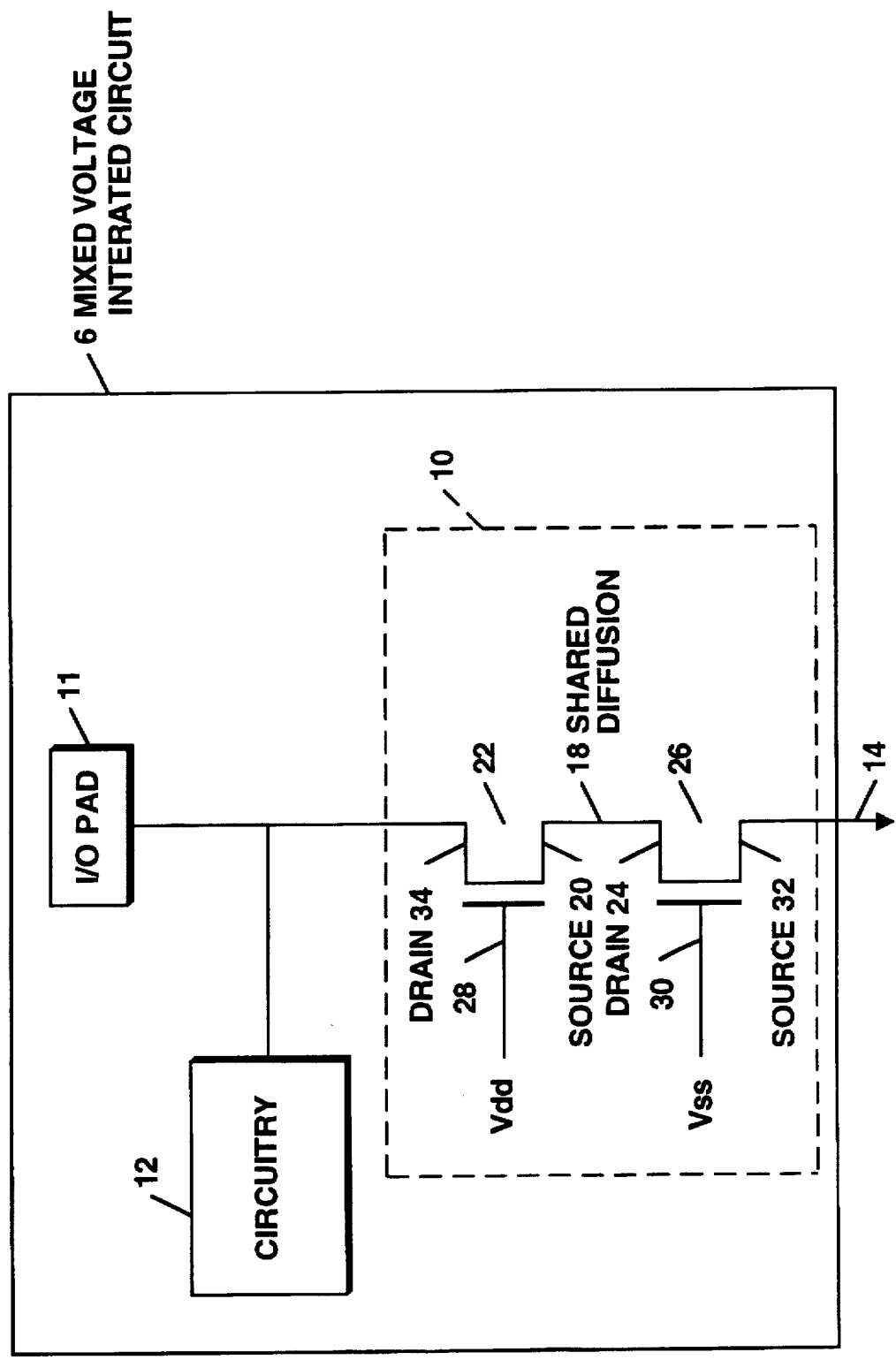
FIG. 2 depicts an electrostatic discharge protection circuit coupled to a mixed voltage integrated circuit's input/output (I/O) pad.

Referring to FIG. 2, an electrostatic discharge (ESD) protection device 10 is shown coupled to a mixed voltage integrated circuit's 6 input/output (I/O) pad 11. During the occurrence of an ESD event, the circuitry 12 coupled to the I/O pad 12 will be protected against damage based on the ability of the protection device 10 to limit voltage and shunt current to electrical ground 14.

The ESD protection device is based on a cascode configuration of NMOS transistors whose common nodes are formed by a shared diffusion 18. By shared diffusion it is meant that the same diffusion of NMOS material constructing the source region 20 of the first transistor 22 also constructs the drain region 24 of the second transistor 26. The arrangement of the present invention is in contrast to the usual layout of a cascode structure where the transistors are laid-out as distinct devices or, in the case of a multi-fingered device, where the devices are merged into the same active area and only one finger shares the common diffusion.

The cascode configuration of the present invention is superior to that of the prior art in part because of its inherent flexibility. The cascode configuration with shared diffusions can be used as a self protecting pulldown stage of a mixed voltage I/O driver, or as a separate ESD voltage protection clamp. The device is laid-out having a shared diffusion 18 which includes a common node constructing both the source 20 of a first NMOS transistor (NMOST) 22 and the drain 24 of a second transistor 26. Both transistors are merged into the same active area. The gate 28 of the first NMOST is tied to the low supply voltage (Vdd) while the gate 30 and source 32 of the second NMOST are tied to ground 14. The I/O pad 12 and pull-up portion of the I/O driver are connected to the drain 34 of the first transistor 22.

Figure 3:
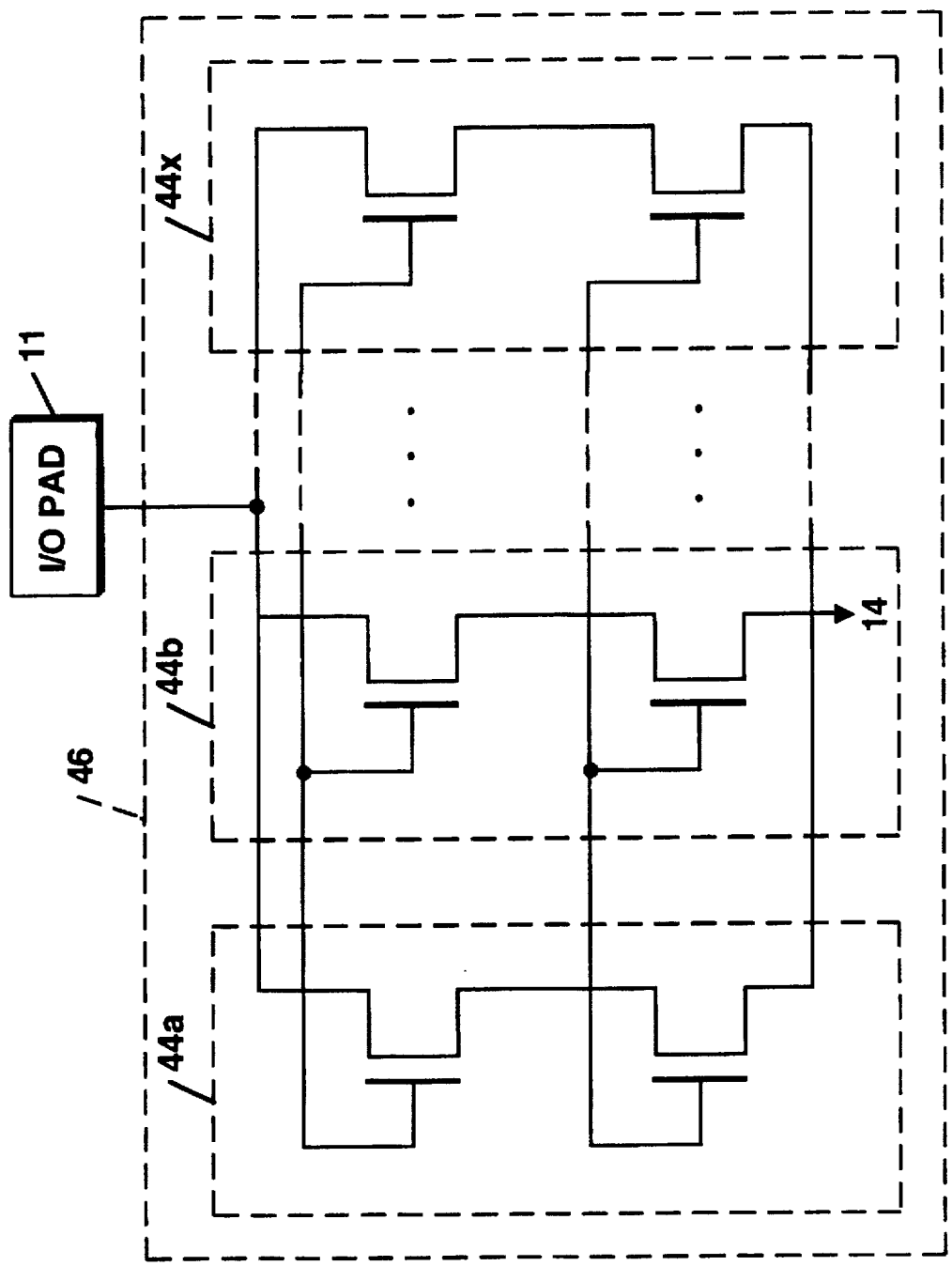
FIG. 3 depicts a plurality of parallel cascode configured transistors which may be coupled to the I/O pad of FIG. 1.

A person having ordinary skill in the art will appreciate that the number of cascode configured transistors 10 is not limited to a single pair such as depicted in FIG. 2. For example, as shown in FIG. 3, an ESD protection device 46 is shown to include a plurality of cascode configured NMOS transistor pairs 44a–44x sharing a common active area, and connected in parallel. Although only three pairs of transistors, 44a, 44b, and 44x, are shown, it should be understood that the number of cascode pairs are design dependent. That is, the number of parallel cascode configurations depends upon the amount of current that each pair of NMOS transistors can carry and the maximum current that the devices are likely to experience during normal operation and electrostatic discharge.

Figure 4:
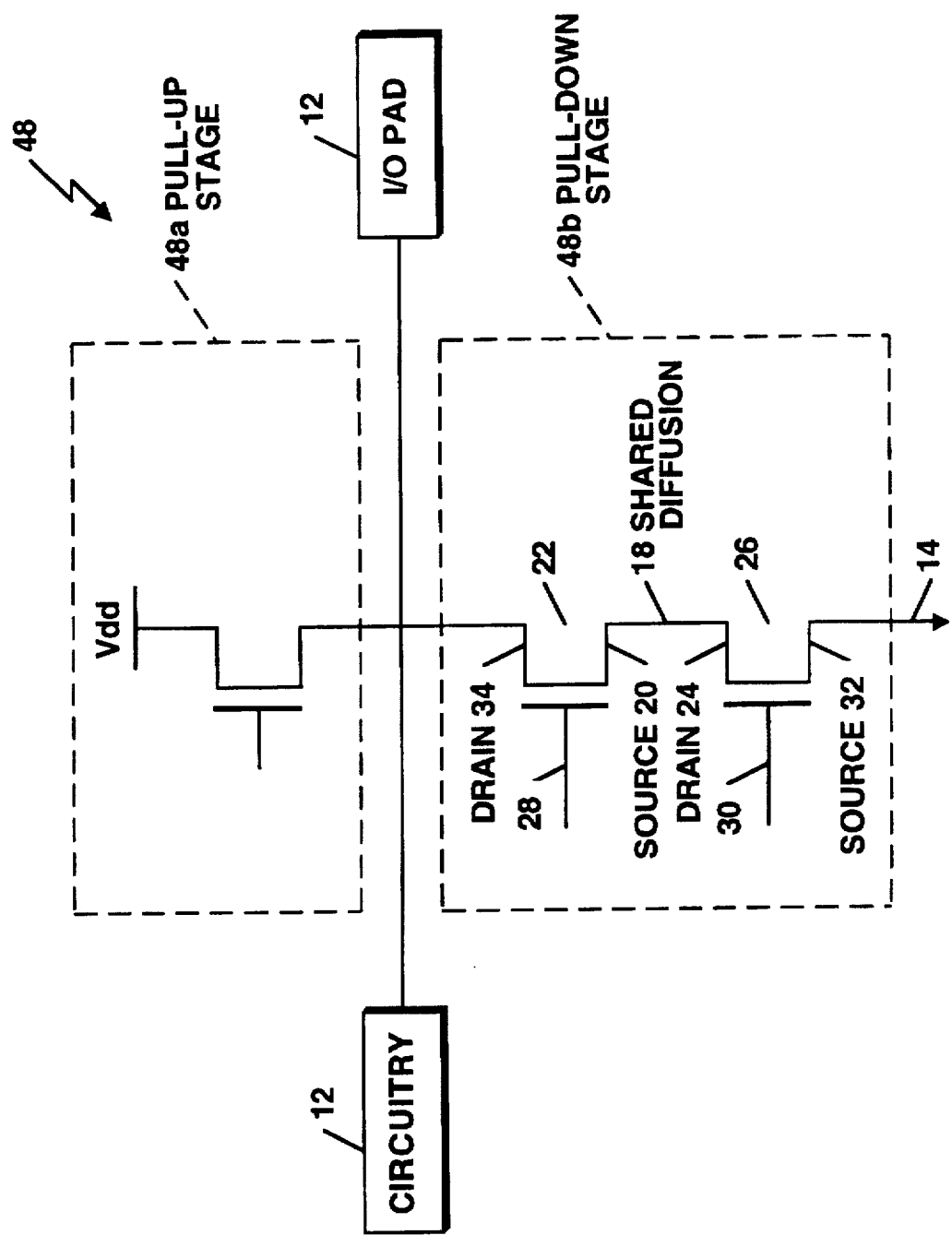
FIG. 4 depicts the electrostatic discharge protection device of FIG. 2 employed as the pull-down stage of an I/O driver.

Referring again to FIG. 2, the cascode configured device 10 is protected during normal operation because the voltage at each shared diffusion 18 is limited to the supply voltage (Vdd) minus the threshold voltage of the NMOS transistor. Because of this limitation, voltages across the oxides and channels of each part of the device are restricted to safe levels during normal operation while, during an ESD event, the cascode configuration provides a path for the ESD current to reach electrical ground 14. By shunting the ESD current to ground 14 via transistors 22 and 26, an I/O driver stage connected to the drain 34 of NMOST device 22 is protected from damaging voltage and current levels. Referring now to FIG. 4, an I/O driver stage 48 is shown having a pull-up stage 48a coupled to the cascode configured NMOS transistor device 48b of the present invention. The cascode NMOST device is used as the pulldown stage of the driver, thus constructing a self protecting I/O driver circuit.

When the protection device is used as a separate ESD clamp, as shown in FIG. 2, its robustness can be increased by blocking both silicide and LDD. The salicide process reduces propagation delay in transistors by depositing metal on top of an existing transistor. LDD involves doping the drain region closest to the channel lighter than the rest of the area. The result is a less abrupt, or more graded, junction between the drain and channel regions. After the salicide process is complete the propagation time between devices is thereafter determined by the characteristics of the metal used, while the properties of the transistor itself are determined by the polysilicon gate's characteristics. The problem with the salicide process is that it produces a non-uniform thickness of metal and hence a non-uniform resistance along the drain and source areas of the device. Current flows unevenly through this non-uniform resistance producing a hot spot where the current flow is the strongest. As the temperature of the hot spot increases, the current flow also increases. These related effects develop into a self supporting loop referred to as thermal runaway. Thermal runaway occurs when most of the current flows through the hot spot, raising its temperature enough to melt metal in the immediate area. Therefore if a metal contact is placed too close to the hot spot, it will melt and damage the device. Accordingly, to overcome this problem in the current invention the silicide is preferably blocked from being deposited over certain sections of the drain and source. As a result, the contacts are pushed farther from the gate and farther from the hot spot. A greater degree of heat is then required for the contacts to reach the melting point. By blocking the silicide and LDD, the ESD protection device is more reliable and less likely to become damaged during an ESD event.

Figure 5:
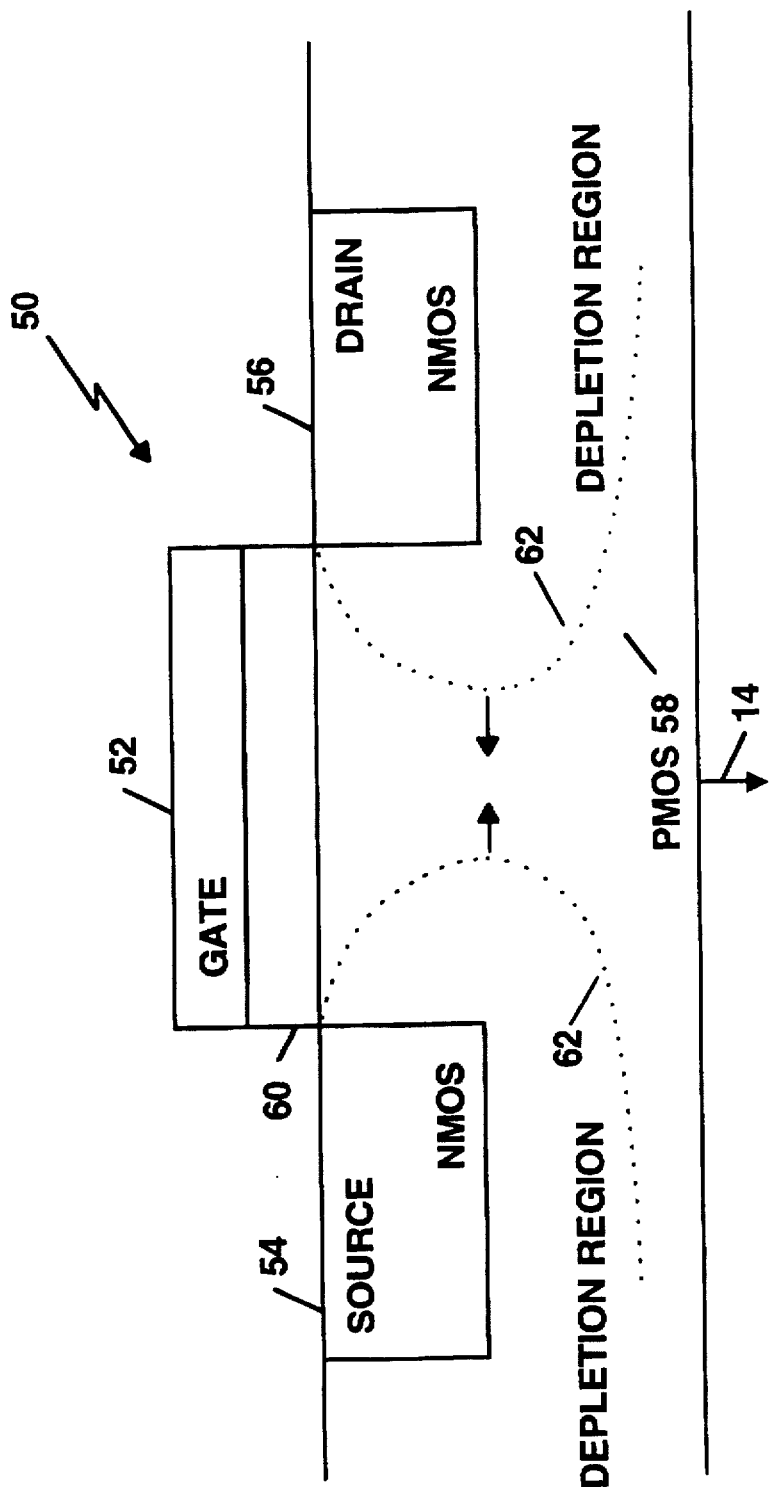
FIG. 5 depicts the depletion regions surrounding the drain and source in a cross section view of an NMOS transistor comprising the electrostatic discharge protection circuit of FIG. 2.

In each of the NMOST cascode configurations of FIGS. 2, 3, and 4, snap-back must occur in the device before the ESD current can be shunted to ground. The term snap-back refers to an operating region of MOS transistors. Referring now to FIG. 5 a cross section view of an NMOS transistor 50 used in the present invention is shown. The NMOS transistor 50 comprises a gate region 52, a source region 54 and a drain region 56 coupled to a PMOS region 58.

To understand the phenomena of snap-back, first consider that the gate 52 and source 54 regions of the NMOST 50 are coupled to ground 14 and that a voltage source is coupled to the drain region 56. Initially, this configuration will not conduct current from drain-to-source because there is no forward biased threshold voltage imposed across the gate-to-source junction 60. As the voltage coupled to the drain 56 is increased, a field 62 is built up in the PMOS region 58 around the drain 56 and source 54. This is called the depletion region 62, and it increases proportionately with the increasing voltage on the drain 56.

Figure 6:
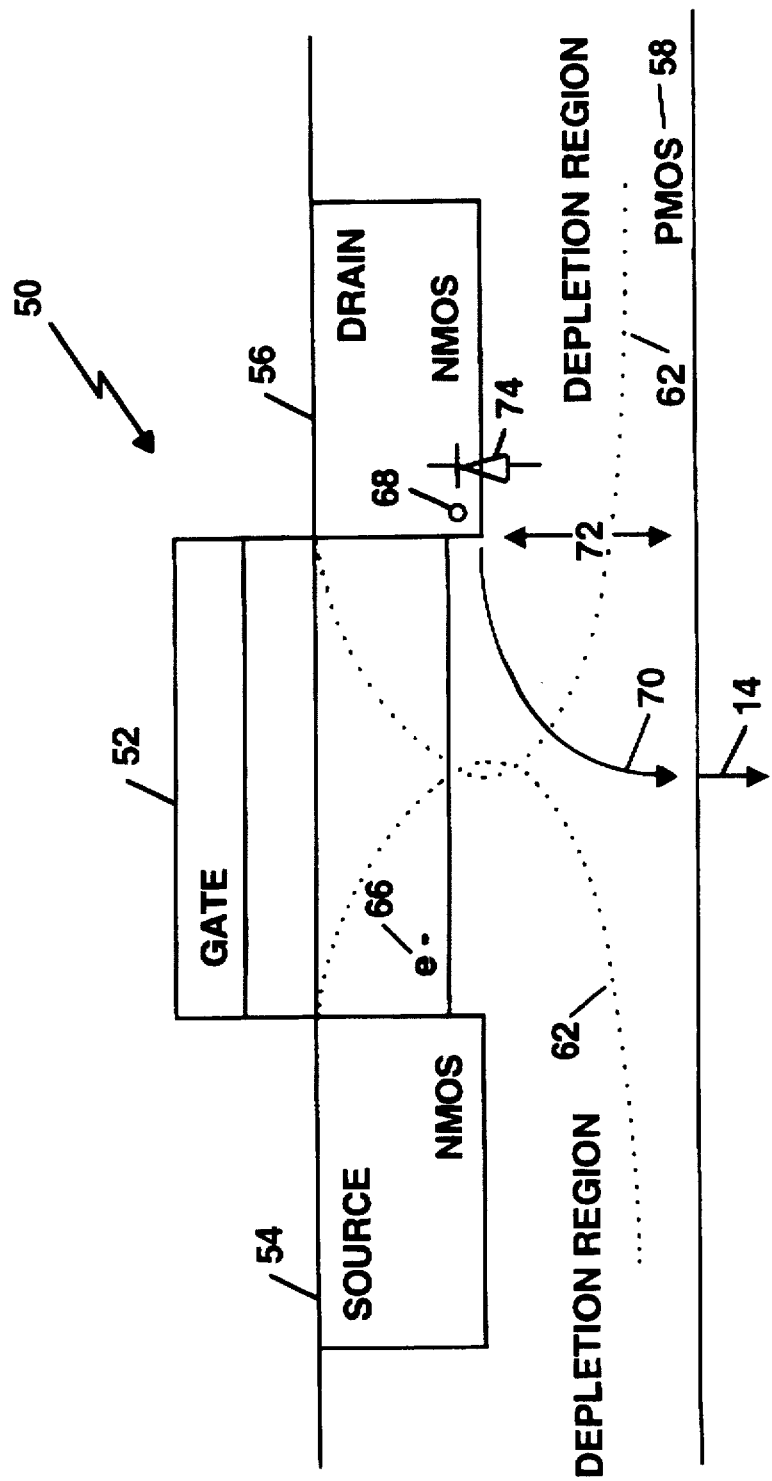
FIG. 6 depicts the state of the depletion regions surrounding the drain and source in a cross section view of an NMOS transistor comprising the electrostatic discharge protection circuit of FIG. 2 when Punch-through occurs.

Referring now to FIG. 6 an NMOS transistor 50, similar to that of FIG. 5, along with associated source and drain depletion regions 62 are shown. In the NMOST 50 of FIG. 6, it can be seen that the depletion regions 62 of the source 54 and drain 56 are merged. Such an event occurs in the following manner. When the drain voltage reaches a certain value, referred to as the trigger voltage, the two depletion regions 62 intersect with each other. This action, called Punch-through, allows a small number of electrons 66 to pass from source 54 to drain 56 through the PMOS region 58. The action of the electron 66 jumping into the NMOS drain region 56 causes a collision with the silicon lattice known as impact ionization. During impact ionization, an electron is disengaged from its covalent bond and generates a space referred to as a hole 68. The hole 68, following the closest path 70 to a lower potential, passes through the PMOS region 58 and into electrical ground 14. Because there is resistance in the PMOS substrate 58, the current generated by the migrating hole gives rise to a voltage 72. As the depletion regions 62 grow in strength, more electrons 66 pass from source 54 to drain 58 causing more holes 68 to pass through the substrate 58.

When the voltage 72 exceeds the turn-on voltage of a diode 74, formed by the junction of the NMOS material of the drain region 56 and the PMOS material 58 of the active region, it conducts. Once the diode 74 turns on, a larger hole current 70 will flow directly from the drain 56 through the substrate 58 and a larger electron current will flow from source 54 to drain 56. It should be noted that this flow of electrons 66 is not normal channel conduction but rather, happens below the channel. Once the current flow 70 is started, it will sustain the forward bias voltage 72 on the diode 74 and only a very small depletion region 62 will be necessary to allow the current to remain flowing. This operating region is referred to as snap-back and is used by the device 10 to provide ESD protection.

Figure 7:
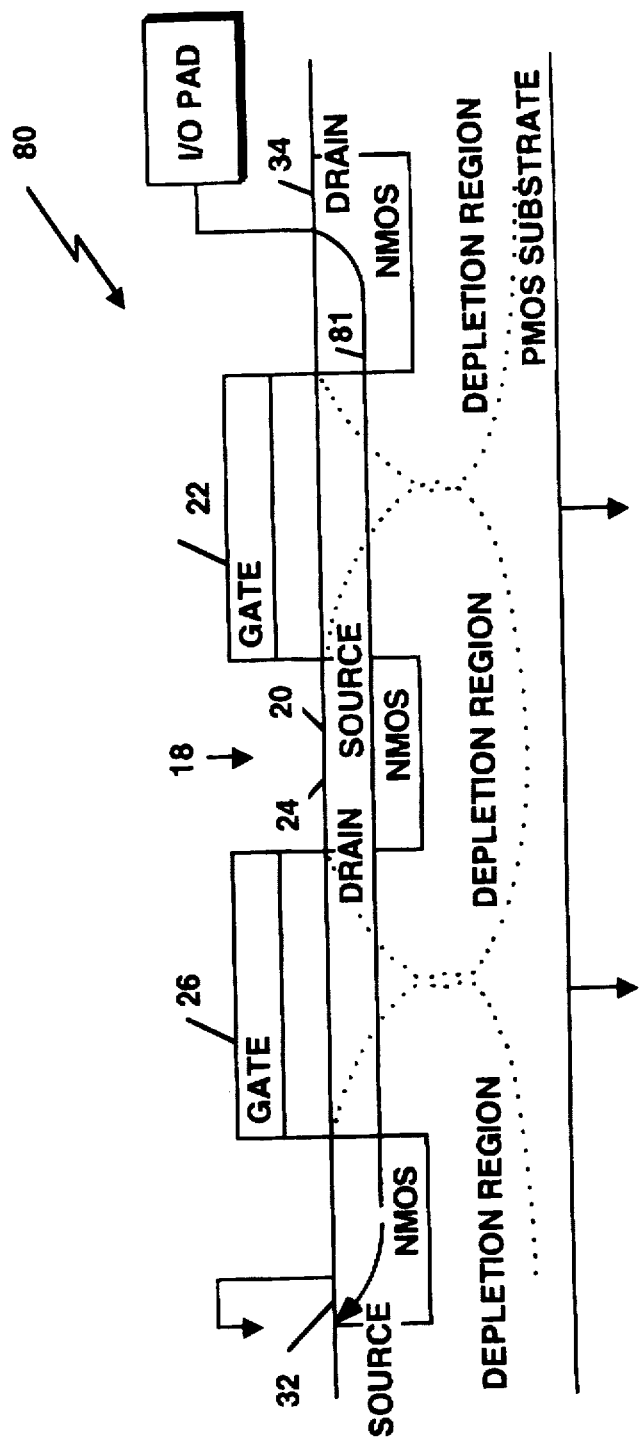
FIG. 7 depicts a cross-section view of the electrostatic discharge protection device when both NMOS transistors are in snap-back and the ESD current is being shunted to ground.

Referring now to FIG. 7, a cross section view 80 of the cascode configured NMOST device 10 of the present invention is depicted. The shared diffusion area 18 constructs the source 20 of a first transistor 22 and the drain 24 of a second transistor 26. Once both transistors enter the snap-back region of operation, a low impedance path 81 from the I/O pad to electrical ground is formed. ESD current is shunted to ground along this path 81, and the associated device is protected from damage.

Figure 8:
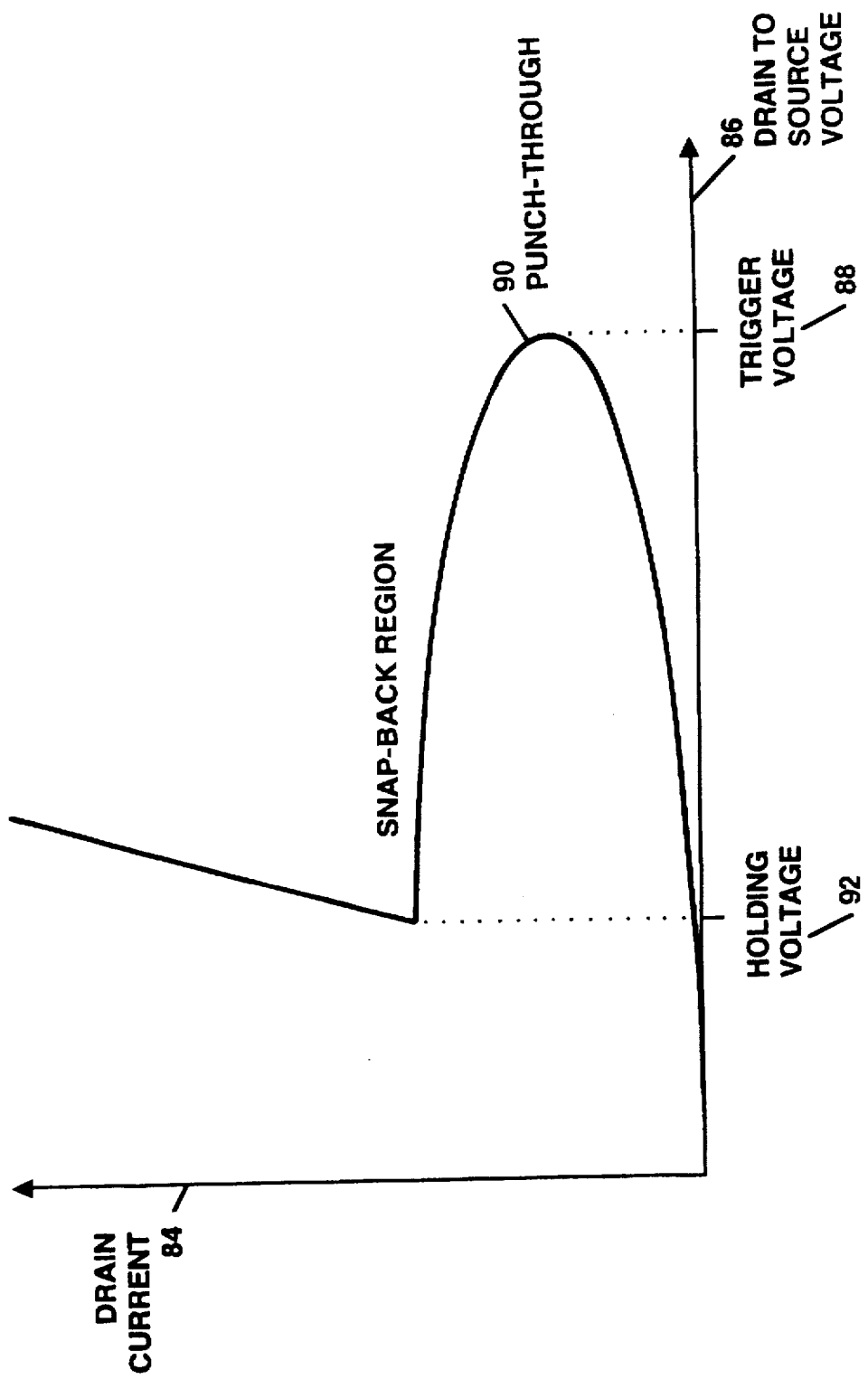
FIG. 8 is a diagram depicting drain current versus the drain-to-source voltage of the NMOS transistor of FIG. 5.

Referring now to FIG. 8, a graph is shown depicting the drain current 84 versus the drain-to-source voltage 86 of the type of NMOS transistor used in the preferred embodiments. During an ESD event, the drain-to-source voltage 86 will increase very rapidly until it reaches the trigger voltage 88. At this point the transistor will experience punch-through 90, and will clamp the drain-to-source voltage 86, and hence the coupled I/O driver, to the lower holding voltage 92.

Figure 9:
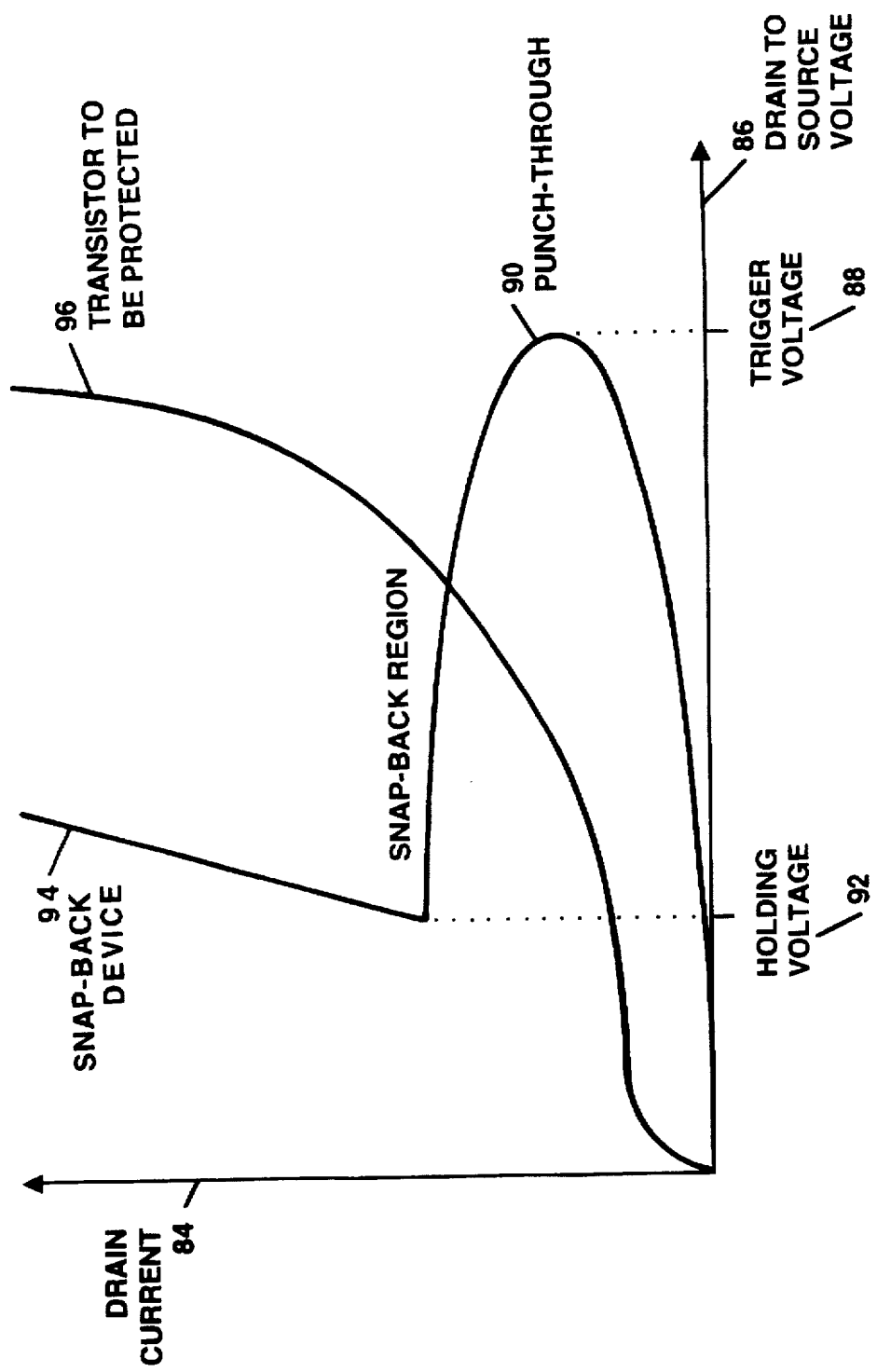
FIG. 9 depicts the current versus voltage curve of the NMOS transistor of FIG. 5 superimposed over the operating curve of a device to be protected from electrostatic discharge.

Referring now to FIG. 9, the current versus voltage curve 94 of a punch-through device is superimposed over the operating curve 96 of a transistor to be protected from an ESD event. Because an ESD event occurs very quickly, the amount of time that the punch-through transistor takes to reach the trigger voltage 88, and then to clamp at the holding voltage 92, is very small when compared to the time it would take the same voltage to destroy the transistor's oxide layer. Therefore, no destruction occurs before the protection circuit clamps the I/O pad to the holding voltage 88. The curves depicted in FIG. 9 show that when the transistor clamps the I/O stage to the holding voltage 92, the I/O transistor is at an acceptable level of drain current 84. Therefore no damage to the I/O stage will occur.

Figure 10:
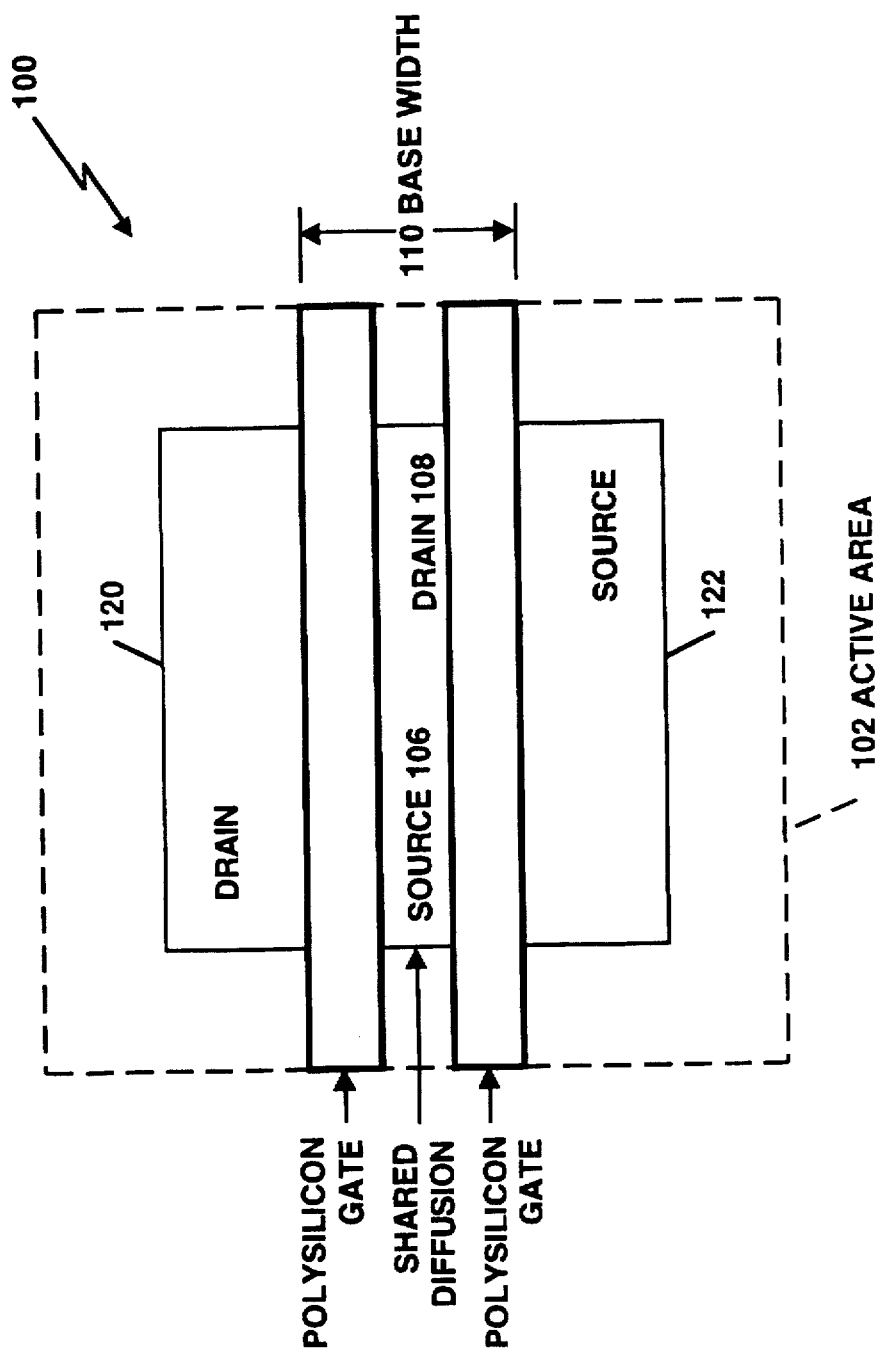
FIG. 10 depicts a top, or layout, view of the cascode configured NMOS protection transistors of FIG. 2.

Referring now to FIG. 10, a top view of the layout 100 of the cascode configured ESD protection transistors is depicted. The transistors are fabricated as a single device in the same active area 102. The common node which joins the two transistors is a shared diffusion 104 which constructs the source 106 of one transistor and the drain 108 of another. A critical feature of the ESD protection device is that the bipolar base width 110 of the equivalent transistor, which determines the trigger voltage 88 and holding voltage 92, is defined by the distance between the top 120 and bottom 122 diffusions. Changing this critical distance 110, by changing the length of the shared diffusion 104 when the device is laid-out, tailors the trigger voltage 88 and holding voltage 92 to the required values. This is a benefit over having to increase the channel length of each device separately, which is required when the transistors are fabricated as independent devices. Increasing the length of the shared diffusion 104 has the benefits of not increasing the capacitance, not reducing the drive strength, and not increasing the channel leakage current of the driver. In this beneficial manner, the ESD protection circuit can be tailored to the specific I/O driver by making the trigger voltage sufficiently large so that the devices will not punch-through and enter the snap-back region during normal operation.

Figure 11:
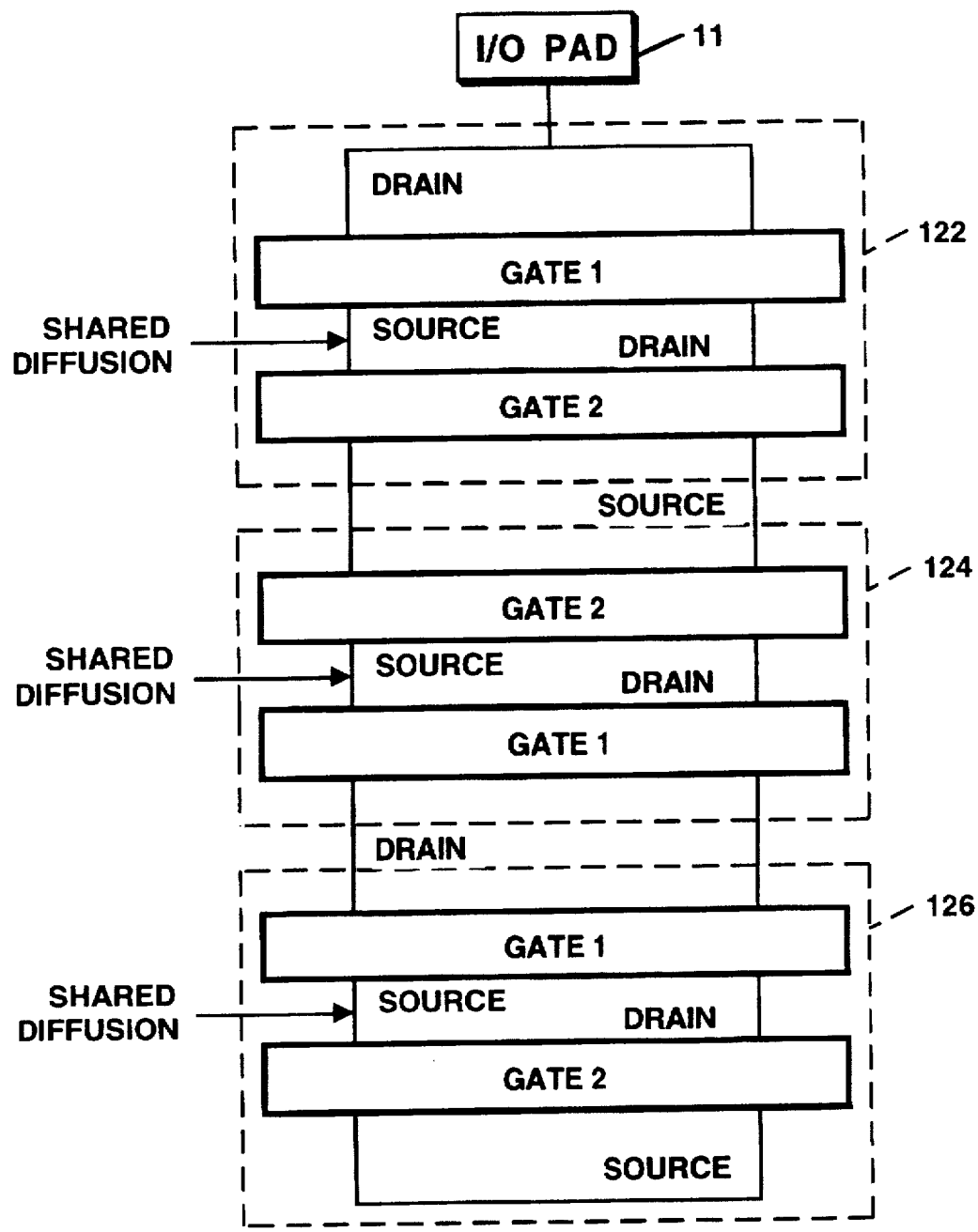
FIG. 11 depicts a top view of a plurality of cascode configured NMOS protection transistors connected in parallel as shown in FIG. 3, disposed in a mixed voltage integrated circuit.

Referring now to FIG. 11, the layout 120 of a parallel connection of three cascode configurations is depicted. When more than one pair of cascode configured transistors are used, they are interleaved rather than simply having one finger share the common diffusion. In such a configuration each pair of NMOS transistors will experience a percentage of the total ESD current flowing through the structure to ground. It will be appreciated by one with ordinary skill in the art that increasing the number of cascode configurations will proportionately reduce the amount of current flowing through each pair of transistors. Therefore, the number of transistors to be used is unlimited by this method of ESD protection.

Having described a preferred embodiment of the invention, it will now become apparent to one of ordinary skill in the art that other embodiments incorporating its concepts may be used. It is felt, therefore, that this embodiment should not be limited to the disclosed embodiment, but rather should be limited only by the spirit and scope of the appended claims.

What is claimed is:

1. An electrostatic discharge protection device for coupling to a mixed voltage integrated circuit to protect said integrated circuit against damage from electrostatic discharge comprising:

at least one cascode configured transistor pair, each of said pairs comprising:

a first NMOS transistor having a gate region, a source region, and a drain region, said drain region coupled to said mixed voltage integrated circuit, said gate region coupled to a low power supply of said mixed voltage integrated circuit;

a second NMOS transistor, merged into the same active area as said first transistor, having a gate region, a source region, and a drain region, said gate region and said source region of said second NMOS transistor coupled to a ground plane of said mixed voltage integrated circuit;

a shared diffusion region coupling the source region of said first NMOS transistor to the drain region of said second NMOS transistor, said shared diffusion region constructing the source region of said first NMOS transistor and constructing said drain region of said second NMOS transistor.

2. The electrostatic discharge protection device of claim 1 wherein the length of said shared diffusion region controls a trigger voltage and a holding voltage of said transistor pair.

3. The electrostatic discharge protection device of claim 2 wherein said electrostatic discharge protection device protects an input stage of said mixed voltage integrated circuit.

4. The electrostatic discharge protection device of claim 2 wherein said electrostatic discharge protection device protects an output stage of said mixed voltage integrated circuit, said protection device comprising a pulldown portion of said output stage of said mixed voltage integrated circuit.

5. The electrostatic discharge protection device of claim 2 wherein said electrostatic discharge protection device protects an output stage of said mixed voltage integrated circuit, said protection device comprising a separate protection clamp.

6. The electrostatic discharge protection device of claim 2 wherein said electrostatic discharge protection device protects an input/output stage of said mixed voltage integrated circuit, said protection device comprising a pulldown portion of said input/output stage of said mixed voltage integrated circuit.

7. The electrostatic discharge protection device of claim 2 wherein said electrostatic discharge protection device protects an input/output stage of said mixed voltage integrated circuit, said protection device comprising a separate protection clamp.

8. A cascode electrostatic discharge protection device comprising:

an active area constructed of diffused PMOS material;

a first polysilicon region disposed over said active area, said polysilicon region constructing the gate region of a first NMOS transistor;

a second polysilicon region disposed over said active area and parallel to said first polysilicon region, said second polysilicon region constructing the gate region of a second NMOS transistor;

a first NMOS region, disposed in said active area, constructing the drain of said first NMOS transistor;

a second NMOS region, disposed in said active area, constructing the source of said first NMOS transistor and constructing the drain of said second NMOS transistor;

a third NMOS region, disposed in said active area, constructing the source of said second NMOS transistor.

9. A cascode electrostatic discharge protection device comprising:

an active area constructed of diffused PMOS material;

a plurality of polysilicon regions disposed over said active area, said plurality of polysilicon regions constructing the gate regions of a plurality of pairs of NMOS transistors, each of said pairs of NMOS transistors comprising:

a first NMOS region, disposed in said active area, constructing the drain of said first NMOS transistor;

a second NMOS region, disposed in said active area, constructing the source of said first NMOS transistor and constructing the drain of said second NMOS transistor;

a third NMOS region, disposed in said active area, constructing the source of said second NMOS transistor.

* * * * *